United States Patent
Liu et al.

(10) Patent No.: US 10,424,598 B2
(45) Date of Patent: Sep. 24, 2019

(54) THREE-DIMENSIONAL MEMORY DEVICE AND MANUFACTURING METHOD THEREOF

(71) Applicant: NuStorage Technology Co., Ltd., Apia (WS)

(72) Inventors: Fu-Chou Liu, Hsin-Chu County (TW); Yung-Tin Chen, Taoyuan (TW)

(73) Assignee: NUSTORAGE TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/029,765

(22) Filed: Jul. 9, 2018

(65) Prior Publication Data

US 2019/0123061 A1 Apr. 25, 2019

(30) Foreign Application Priority Data

Oct. 20, 2017 (CN) .......................... 2017 1 0985976

(51) Int. Cl.
*H01L 27/11597* (2017.01)
*G11C 11/22* (2006.01)
*H01L 27/1159* (2017.01)
*H01L 27/11587* (2017.01)

(52) U.S. Cl.
CPC ...... *H01L 27/11597* (2013.01); *G11C 11/223* (2013.01); *H01L 27/1159* (2013.01); *H01L 27/11587* (2013.01)

(58) Field of Classification Search
CPC ......... H01L 27/11597; H01L 27/11587; H01L 27/1159; G11C 11/223
See application file for complete search history.

(56) References Cited

U.S. PATENT DOCUMENTS

| | | | |
|---|---|---|---|
| 9,685,215 B1 * | 6/2017 | Kang | ................... H01L 27/1159 |
| 2016/0225775 A1 * | 8/2016 | Park | ..................... H01L 29/516 |
| 2016/0372478 A1 * | 12/2016 | Ino | ........................ C23C 14/083 |

* cited by examiner

*Primary Examiner* — Peter Bradford
(74) *Attorney, Agent, or Firm* — Li & Cai Intellectual Property (USA) Office

(57) ABSTRACT

A three-dimensional memory device and a manufacturing method thereof are provided. The three-dimensional memory device includes a plurality of bottom control gate lines, a plurality of bottom source lines, a stacked structure on the bottom source lines, a plurality of bit lines disposed on the stacked structure, and a plurality of pillar structures passing through the stacked structure. The stacked structure includes a plurality of stacked layers insulated from one another and respectively located at different levels. Each stacked layer includes a plurality of word lines. Each word line and the corresponding pillar structure, which is connected between the corresponding bit line and the corresponding bottom source line, define a memory cell. Each pillar structure includes an outermost ferroelectric layer, a conductive core gate column, and a surrounding channel layer disposed therebetween. The conductive core gate column is electrically connected to the corresponding bottom control gate line.

8 Claims, 17 Drawing Sheets

THREE-DIMENSIONAL MEMORY DEVICE AND MANUFACTURING METHOD THEREOF

CROSS-REFERENCE TO RELATED PATENT APPLICATION

This application also claim the priority benefit of a prior application Ser. No. CN 201710985976.2 filed Oct. 20, 2017. The entirety of the aforementioned patent applications is hereby incorporated by reference herein and made a part of this specification.

FIELD OF THE DISCLOSURE

The disclosure relates to a three-dimensional memory device and manufacturing method thereof in particular, to a double-gate three-dimensional memory device and manufacturing thereof.

BACKGROUND OF THE DISCLOSURE

Currently, three-dimensional memory devices with different structures, such as NAND flash memories including a plurality of stacked thin film transistors, have been developed in the industry to achieve higher storage capacity. Specifically, a conventional three-dimensional memory includes a plurality of bit lines, a plurality of source lines and a plurality of vertically stacked memory layers. Each of the memory layers includes a plurality of word lines. Additionally, the conventional three-dimensional memory further includes a plurality of vertical channels passing through the memory layers, and each of the word lines and the vertical channels passing through the memory layers define a plurality of memory cells.

Generally, the conventional three-dimensional memory can be programmed and read by controlling the voltages applied to the word lines, the bit lines, and the source lines. To be more specific, a plurality of memory cells vertically arranged between the corresponding bit line and the corresponding source line are connected in series.

However, when write states of the serially connected memory cells are read, two different voltages are respectively applied to the corresponding one of the bit lines and the corresponding one of the source lines, a read voltage is sequentially applied to each of the word lines along the vertical direction from bottom to top (or from top to bottom), and then the current value corresponding to each of the word lines is measured to determine the write state of each of the memory cells. That is to say, when the conventional three-dimensional memory is read, the read sequence of the memory cells cannot be changed arbitrarily. Only if the memory cells are read in a particular sequence (from top to bottom or from bottom to top) will the write state of each of the memory cells be determined, thereby affecting the speeds of writing and reading.

Furthermore, when the conventional three-dimensional memory is programmed and read, program disturbance and read disturbance in non-selected memory cells usually come up, which affects the device window and the performance of the memory device.

SUMMARY OF THE DISCLOSURE

The present disclosure is to provide a three-dimensional memory device and a manufacturing method thereof, to resolve the problems of the conventional three-dimensional memory and thus arbitrarily read write states of the serially connected memory cells arranged in a vertical direction.

In order to achieve the aforementioned objectives, according to an embodiment of the disclosure, a three-dimensional memory device is provided. The three-dimensional memory device includes a plurality of bottom control gate lines, a plurality of bottom source lines, a stacked structure, a plurality of bit lines, and a plurality of pillar structures. The bottom control gate lines extend in a first horizontal direction and are arranged in parallel. The bottom source lines disposed over the bottom control gate lines extend in a second horizontal direction and intersect with the bottom control gate lines. The stacked structure is disposed on the bottom source lines and includes a plurality of stacked layers which are insulated from one another and respectively located at different levels. Each of the stacked layers includes a plurality of word lines extending in the second horizontal direction, and each of the word lines corresponds to at least one of the bottom source lines. The bit lines are disposed on the stacked structure and extend in the first horizontal direction and cross the bottom source lines. The pillar structures pass through the stacked structure. Each of the pillar structures is connected between the corresponding one of the bit lines and the corresponding one of the bottom source lines, and each of the word lines and the corresponding one of the pillar structures define a memory cell. Each of the pillar structures includes an outermost ferroelectric layer, a conductive core gate column, and a surrounding channel layer disposed between the outermost ferroelectric layer and the conductive core gate column, and the conductive core gate column is electrically connected to the corresponding one of the bottom control gate lines.

According to another embodiment of the disclosure, a manufacturing method of a three-dimensional memory device is provided. In the manufacturing method, a plurality of bottom control gate lines extending in a first horizontal direction are formed. A plurality of bottom source lines extending in a second horizontal direction are formed over and insulated from the bottom control gate lines. Subsequently, a stacked structure is formed on the bottom source lines, in which the stacked structure includes a plurality of stacked layers spaced apart from one another, each of the stacked layers includes a plurality of word lines extending in the second horizontal direction, and each of the word lines corresponds to at least one of the bottom source lines. Furthermore, a plurality of pillar structures are formed in the stacked structure, in which each of the word lines and the corresponding one of the pillar structures define a memory cell. Each of the pillar structures includes an outermost ferroelectric layer, a conductive core gate column, and a surrounding channel layer disposed between the outermost ferroelectric layer and the conductive core gate column, the conductive core gate column being electrically connected to the corresponding one of the bottom control gate lines. Subsequently, a plurality of bit lines extending in the first horizontal direction are formed on the stacked structure, in which the bit lines are respectively aligned with the bottom control gate lines, and each of the pillar structures is connected between the corresponding one of the bit lines and the corresponding one of the bottom source lines.

In the three-dimensional memory device and manufacturing method thereof in the embodiments of the present disclosure, each pillar structure includes a conductive core gate column. As such, when the write states of the memory cells which correspond to the same pillar structure are read, a current flowing in the surrounding channel layer can be generated by applying a voltage to the conductive core gate column so that the electrical connection between the corresponding bit line and the corresponding bottom source line can be established. As such, the current value corresponding to the selected memory cell can be measured. Accordingly, when reading the write state of one of the serially connected memory cells, the voltage can be directly applied to the word line corresponding to the selected memory cell, instead of applying the voltage to the word lines at different levels in a particular sequence, thereby improving the speeds of writing and reading.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
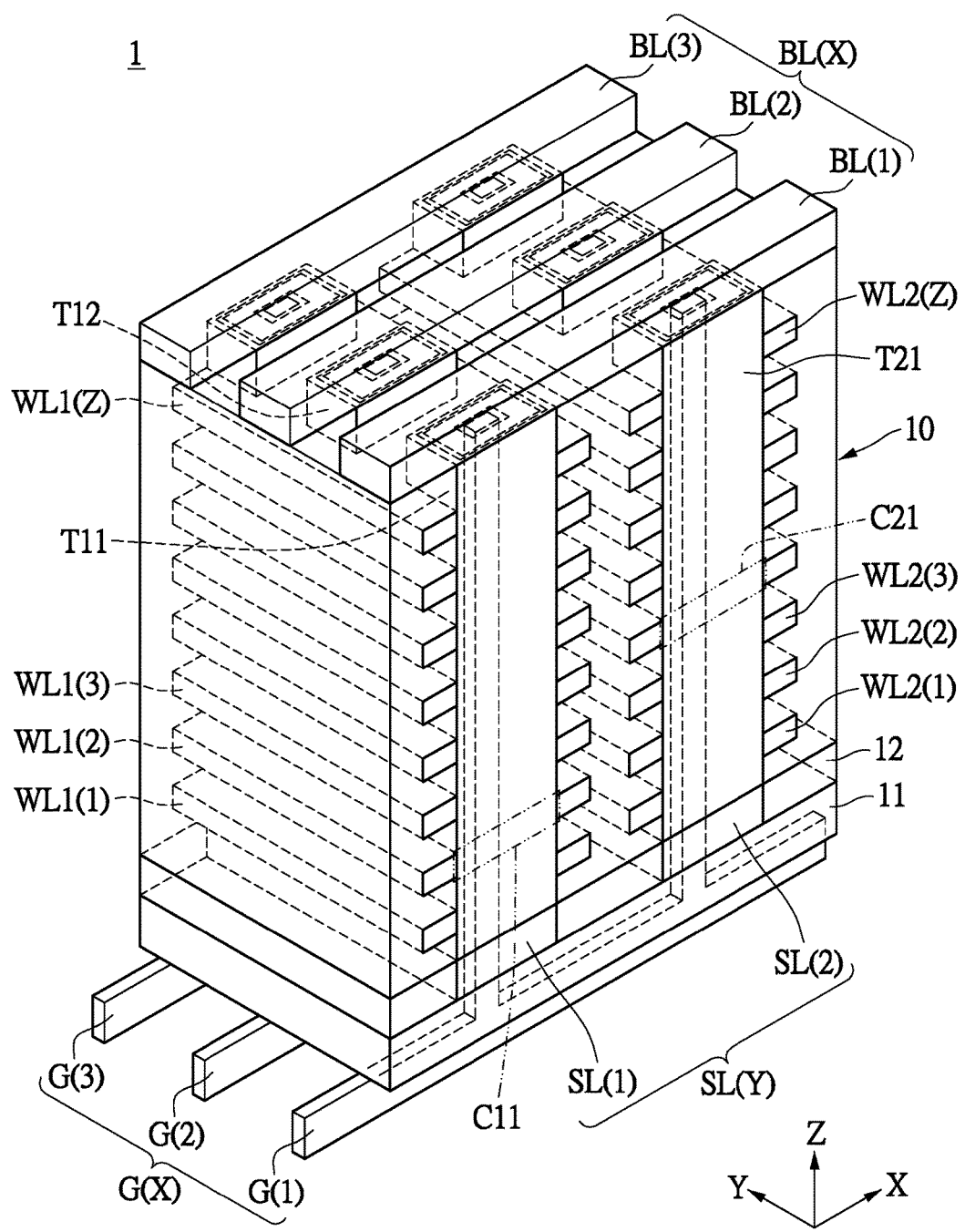
FIG. 1 is a partial perspective view of a three-dimensional memory device according to an embodiment of the present disclosure.
Figure 2:
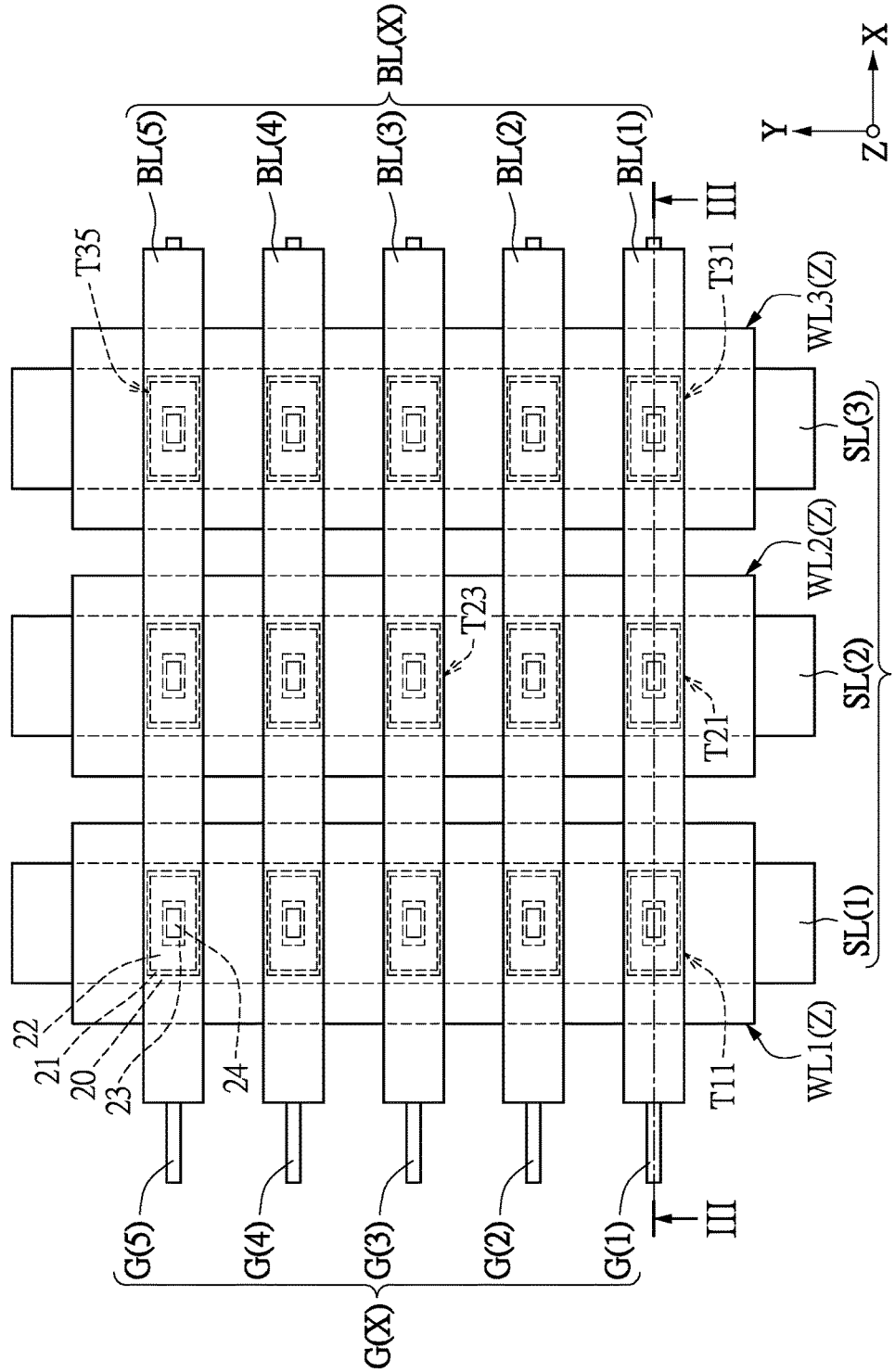
FIG. 2 is a partial top view of the three-dimensional memory device according to an embodiment of the present disclosure.
Figure 3:
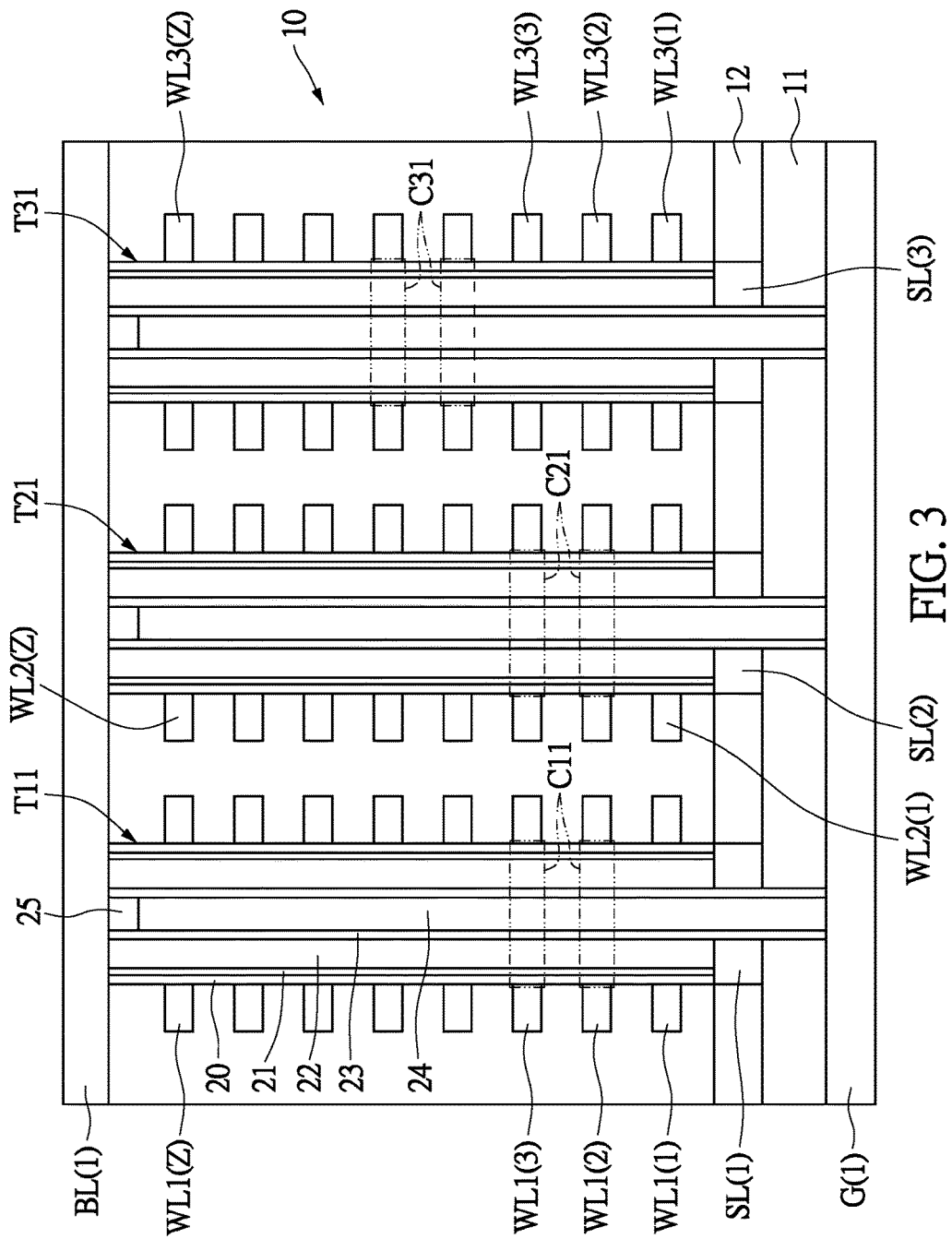
FIG. 3 is a partial sectional view taken along a line III-III of FIG. 2.

Referring to FIG. 1 to FIG. 3, FIG. 1 is a partial perspective view of a three-dimensional memory device according to an embodiment of the present disclosure, FIG. 2 is a partial top view of the three-dimensional memory device according to an embodiment of the present disclosure, and FIG. 3 is a partial sectional view taken along a line III-III of FIG. 2.

The three-dimensional memory device 1 in the embodiment of the present disclosure includes a plurality of bottom control gate lines G(X), a plurality of bottom source lines SL(Y), a stacked structure 10, a plurality of bit lines BL(X), and a plurality of pillar structures T11-T35.

The bottom control gate lines G(X) extend in a first horizontal direction and are arranged in parallel. Only three bottom control gate lines G(1)-G(3) depicted in FIG. 1 are illustrated. In the instant embodiment, the bottom control gate lines G(X) extend in the X-direction and are parallelly arranged along the Y-direction. Furthermore, the bottom control gate lines G(X) are disposed on a substrate (not shown in FIG. 1) and spaced apart from one another. In one embodiment, the material of the bottom control gate line G(X) is metal or heavily-doped semiconductor.

The bottom source lines SL(Y) are disposed over and insulated from the bottom control gate lines G(X). Specifically, in the embodiment of the present disclosure, the three-dimensional memory device 1 further includes a bottom insulating layer 11. The bottom insulating layer 11 is disposed between the bottom control gate lines G(X) and the bottom source lines SL(Y) so that each bottom control gate line G(X) and each bottom source line SL(Y) are insulated from each other by the bottom insulating layer 11.

In addition, the bottom source lines SL(Y) extend in a second horizontal direction. In FIG. 1, only two bottom source lines SL(1) and SL(2) are depicted for illustration. As shown in FIG. 1, the bottom source lines SL(Y) extend in the Y-direction and are parallelly arranged along the X-direction. Accordingly, the vertical projection of the bottom source lines SL(Y) intersects the bottom control gate lines G(X). The bottom source lines SL(Y) disposed on the bottom insulating layer 11 are spaced apart and insulated from one another.

As shown in FIG. 3, the three-dimensional memory device 1 further includes a plurality of insulating portions 12, and each of the insulating portions 12 is disposed between two adjacent bottom source lines SL(Y) so as to insulate one of the two adjacent bottom source lines SL(Y) from the other.

Furthermore, the stacked structure 10 is disposed on the bottom source lines SL(Y). In the instant embodiment, the stacked structure 10 includes a plurality of stacked layers which are insulated from one another and respectively located at different levels. Each of the stacked layers includes a plurality of word lines WL1(Z)-WL3(Z) extending in the second horizontal direction, and each of the word lines WL1(Z)-WL3(Z) corresponds to at least one of the bottom source lines SL(Y).

That is to say, all of the word lines WL1(Z)-WL3(Z) in the stacked structure 10 extend in the Y-direction and are parallelly arranged in the X-direction, for example, the word lines WL1(1), WL2(1), and WL3(1) in the same stacked layer located at the bottom portion of the stacked structure 10.

Accordingly, each of the word lines WL1(Z)-WL3(Z) overlap with at least one of the bottom source lines SL(Y) in the Z-direction. For example, the word line WL1(1) overlaps with the bottom source line SL(1). Furthermore, the word lines WL1(1)-WL1(Z), the word lines WL2(1)-WL2(Z), or the word lines WL3(1)-WL3(Z) are sequentially stacked in the Z-direction and insulated from one another.

For example, the word lines WL1(1)-WL1(Z) are stacked in the sequence from bottom to top. Moreover, any two adjacent word lines in the same stacked layer, such as the word lines WL1(1) and WL2(1), are spaced apart from each other by a predetermined distance. By applying read voltages, write voltages or erase voltages to the word lines WL1(1)-WL1(Z), WL2(1)-WL2(Z), and WL3(1)-WL3(Z), which are stacked over one another in the Z-direction, the three-dimensional memory device 1 can be read or programmed.

The bit lines BL(X) are disposed on the stacked structure 10 and extend in the first horizontal direction. Exemplarily, only three bit lines BL(1)-BL(3) are illustrated in FIG. 1. As shown in FIG. 1, the bit lines BL(X) extend in the X-direction and are parallelly arranged in the Y-direction. Accordingly, the vertical projection of the bit lines BL(X) intersects the bottom source lines SL(Y).

As shown in the top view of FIG. 2, an intersection is formed between each of the bit line BL(X) and each of the bottom source lines SL(Y). These intersections are arranged in an array. In the instant embodiment, the bottom source lines SL(Y) and the bit lines BL(X) are made of heavily-doped semiconductor material. In one embodiment, the bottom source lines SL(Y) and the bit lines BL(X) are made of polysilicon heavily doped with impurities of N-type or P-type conductivity.

Moreover, a plurality of pillar structures T11-T35 pass through the stacked structure 10, and each of the pillar structures T11-T35 is connected between the corresponding one of the bit lines BL(X) and the corresponding one of the bottom source lines SL(Y). As shown in FIG. 2, the pillar structures T11-T35 respectively correspond to the intersections and pass through the stacked structure 10. Accordingly, as shown in FIG. 1, each of the pillar structures T11-T35 passes through the corresponding word lines WL1(1)-WL1(Z), WL2(1)-WL2(Z), or WL3(1)-WL3(Z), which are stacked in the vertical direction (Z-direction). For example, the pillar structure T11 passes through the corresponding word lines WL1(1)-WL1(Z).

Taking FIG. 3 as an example herein, the word lines WL1(1)-WL1(Z) and the pillar structure T11 passing therethrough define a plurality of memory cells C11 which are stacked and serially connected in the Z-direction. In other words, each of word lines (for example, word line WL1(1)) and the corresponding one of the pillar structures (for example, pillar structure T11) define a memory cell C11 therebetween. Accordingly, by controlling the voltages applied to the word lines, respectively, the data can be written into or read from different memory cells.

As shown in FIG. 2, each of the pillar structures T11-T35, from exterior to interior, includes an outermost ferroelectric layer 20, an outer dielectric layer 21, a surrounding channel layer 22, an inner dielectric layer 23, and a conductive core gate column 24. The surrounding channel layer 22 is interposed between the outermost ferroelectric layer 20 and the conductive core gate column 24. The surrounding channel layer 22 is insulated from the conductive core gate column 24 by the inner dielectric layer 23. The surrounding channel layer 22 is also insulated from the outermost ferroelectric layer 20 by the outer dielectric layer 21. Accordingly, the inner dielectric layer 23 is disposed between the surrounding channel layer 22 and the conductive core gate column 24, and the outer dielectric layer 21 is disposed between the surrounding channel layer 22 and the outermost ferroelectric layer 20.

Please referring to FIG. 2 in conjunction with FIG. 3, the outermost ferroelectric layer 20 of each pillar structure is in contact with multiple corresponding word lines. As shown in FIG. 3, the outermost ferroelectric layer 20 of the pillar structure T11 is in contact with the word lines WL1(1)-WL1(Z), the outermost ferroelectric layer 20 of the pillar structure T21 is in contact with the word lines WL2(1)-WL2(Z), and the outermost ferroelectric layer 20 of the pillar structure T31 is in contact with the word lines WL3(1)-WL3(Z).

Furthermore, the two ends of the outermost ferroelectric layer 20 are respectively connected to the corresponding one of the bit lines BL(X) and the corresponding one of the bottom source lines SL(Y). As shown in FIG. 3, one end of the outermost ferroelectric layer 20 of each of the pillar structures T11-T31 is connected to the same corresponding bit line BL(1), and the other end of the outermost ferroelectric layer 20 of each of the pillar structures T11-T31 is connected to the same corresponding bottom source line SL(1).

The outermost ferroelectric layer 20 can be made of a material including a ferroelectric material and dopants, the ferroelectric material is hafnium oxide, hafnium zirconium oxide, or zirconium titanium oxide, and the dopants are silicon, aluminum, lanthanum, yttrium, strontium, gadolinium, niobium, nickel, tantalum, or any combination thereof.

As shown in FIG. 3, the surrounding channel layer 22 is electrically connected to the corresponding one of the bottom source lines SL(Y) and the corresponding one of the bit lines BL(X). In FIG. 3, two ends of the surrounding channel layer 22 of each of the pillar structures T11-T31 are respectively connected to the corresponding bit line BL(1) and the corresponding bottom source line SL(1). In the instant embodiment, the material of the surrounding channel layer 22 can be lightly-doped polysilicon. Furthermore, the conductivity type of the material of the surrounding channel layer 22 is opposite to that of the material of the bit lines BL(X) (and the bottom source lines SL(Y)). For example, when the surrounding channel layer 22 is made of P-type semiconductor, the bit lines BL(X) (and the bottom source lines SL(Y)) can be made of N-type semiconductor.

It should be noted that directions of the electric dipole moments of the outermost ferroelectric layer 20 may be changed according to a write voltage applied to the corresponding one of the word lines WL1(Z)-WL3(Z), such that the outermost ferroelectric layer 20 is polarized. Since the polarization direction of the outermost ferroelectric layer 20 determines the resistance or the conductance of the surrounding channel layer 22 closer to the outermost ferroelectric layer 20, the polarization direction of the outermost ferroelectric layer 20 can be changed by applying the write voltage to the corresponding one of the word lines WL1(Z)-WL3(Z) so as to vary the resistance of the surrounding channel layer 22. Thereafter, by measuring the current of the surrounding channel layer 22, the write state (i.e., "1" or "0") of the memory cell can be determined. The absolute value of the aforementioned write voltage has to be greater than the absolute value of a threshold voltage, which is the minimum voltage for changing the polarization direction of the outermost ferroelectric layer 20. In one embodiment, the threshold voltage for changing the polarization direction of the outermost ferroelectric layer 20 is about −1.5V or +1.5V.

Specifically, one of the memory cells C11 shown in FIG. 3 is taken as an example, provided that the material of the surrounding channel layer 22 is P-type semiconductor, and the material of the bit lines BL(X) (and the bottom source lines SL(Y)) is N-type semiconductor, when the write voltage applied to the word line WL1(3) corresponding to the memory cell C11 is positive (for example, +3V), the polarization direction of a portion of the outermost ferroelectric layer 20 corresponding to the word line WL1(3) can be changed, such that electrons accumulates in a part of the surrounding channel layer 22 in the memory cell C11 which corresponds to the word line WL1(3).

At this time, when the read voltage is applied to the word line WL1(3), and the electrical connection between the bit line BL(1) and the bottom source line SL(1), which are connected to the surrounding channel layer 22 of the pillar structure T11, is established, a higher current flowing through the surrounding channel layer 22 can be measured. According to the higher current, the write state of the memory cell C11 can be determined as a first state of better conductivity. It should be noted that the absolute value of the read voltage is usually less than that of the threshold voltage to prevent the polarization direction of the outermost ferroelectric layer 20 from being disturbed.

On the other hand, when the write voltage applied to the word line WL1(3) is negative (for example, −3V), the polarization direction of the portion of the outermost ferroelectric layer 20 in the memory cell C11, which corresponds to the word line WL1(3), can be driven to reverse, such that holes accumulates in the part of the surrounding channel layer 22 in the memory cell C11.

At this time, when the read voltage is applied to the word line WL1(3), the electrical connection between the bit line BL(1) and the bottom source line SL(1), which are connected to the surrounding channel layer 22 of the pillar structure T11, is established, a smaller current flowing through the surrounding channel layer 22 can be measured. According to the smaller current, the write state of the memory cell C11 can be determined as a second state of poor conductivity. In one embodiment, the first state can be defined as "1", and the second state can be defined as "0". That is to say, by controlling the voltage applied to each of word lines WL1(Z)-WL3(Z), and then measuring the total current flowing through the surrounding channel layer 22, the write state of each of the memory cells C11-C31 can be determined.

As shown in FIG. 2 and FIG. 3, each of the pillar structures T11-T35 in the embodiment of the present disclosure includes the conductive core gate column 24, and each conductive core gate column 24 is electrically connected to the corresponding one of the bottom control gate lines G(X). Specifically, as shown in FIG. 3, each of the conductive core gate columns 24 passes through, but is insulated from, the corresponding one of the bottom source lines SL(Y) to be electrically connected to the corresponding one of the bottom control gate lines G(X).

Furthermore, each conductive core gate column 24 is isolated from the surrounding channel layer 22 by the inner dielectric layer 23. The inner dielectric layer 23 and the outer dielectric layer 21 can be made of different materials or the same material. In one embodiment, each of the materials of the inner dielectric layer 23 and the outer dielectric layer 21 can be selected from the group consisting of silicon oxide, silicon nitride, silicon oxynitride, and any combination thereof.

Each of the conductive core gate columns 24 is insulated from the bit lines BL(X) and the bottom source lines SL(Y). Specifically, each conductive core gate column 24 passing through the corresponding one of the bottom source lines SL(Y) is insulated from the corresponding one of the bottom source lines SL(Y) by the inner dielectric layer 23. Furthermore, in the embodiment of the present disclosure, each of the pillar structures T11-T35 further includes a core insulating portion 25, and the core insulating portions 25 insulates conductive core gate columns 24 from the bit lines BL(X) connected to the pillar structures T11-T35.

During operation of the three-dimensional memory device 1, by controlling the voltages respectively applied to the bottom control gate lines G(X), the bit lines BL(X), the word lines WL1(Z)-WL3(Z), and the bottom source lines SL(Y), the data can be written into or read from the three-dimensional memory device 1. Furthermore, during programming or reading one of the memory cells C11-C31, the write states of the other unselected memory cells would not be disturbed.

It should be noted that, with the pillar structure T11 as an example, during reading one of the memory cells C11 corresponding to the pillar structure T11, such as the memory cell C11 defined by the word line WL1(3) and the pillar structure T11, the surrounding channel layer 22 of the pillar structure T11 has to be set in a current-conducting state such that the total current can be measured to determine the write state of the selected memory cell C11.

Accordingly, in the embodiment of the disclosure, when reading the write state of one memory cell C11 in the memory device 1, a switch-on voltage is applied to the conductive core gate column 24 of the selected memory cell C11 for conducting currents through the surrounding channel layer 22. Then, the total current value ($I_t$) of the surrounding channel layer 22 is measured. The total current value ($I_t$) of the surrounding channel layer 22 contains the current value ($I_s$) contributed by the selected memory cell C11 and the current value ($I_c$) contributed by the non-selected memory cells C11 which are electrically connected to the selected memory cell C11 in series.

Since the non-selected memory cells C11 may be in the first state or in the second state, each of the other word lines WL1(1)-WL1(2) and WL1(4)-WL1(Z) that correspond to the non-selected memory cells C11 have to be applied with a conducting voltage ($V_{pass}$) so as to allow the current to flow through the surrounding channel layer 22. It should be noted that the absolute value of the conducting voltage has to be less than that of the threshold voltage to prevent the write states of the non-selected memory cells from being disturbed. On the other hand, when the conducting voltage ($V_{pass}$) is applied, determination of the write state of the selected memory cell C11 has to be prevented from being affected by the current value ($I_c$) contributed by the non-selected memory cells C11.

Figure 4:
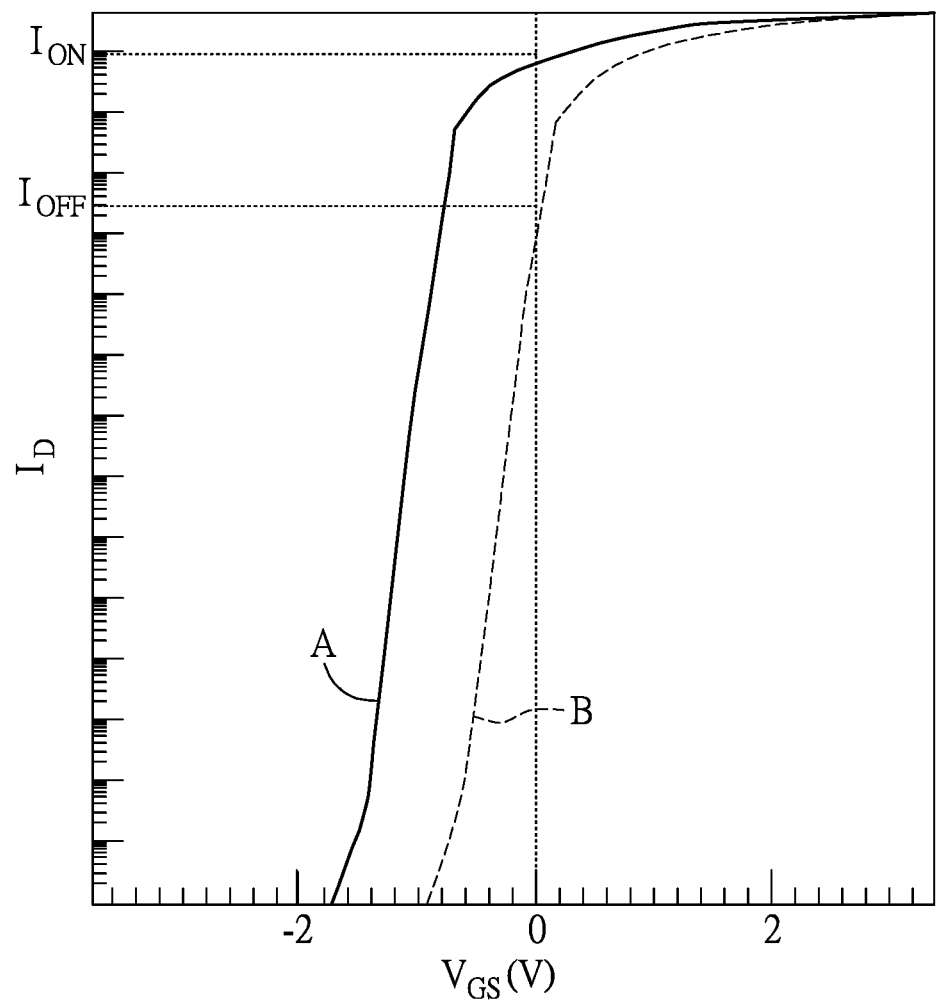
FIG. 4 shows voltage-current relationship curves of the memory cell in different write states according to an embodiment of the present disclosure.

Referring to FIG. 4, FIG. 4 shows voltage-current relationship curves of the memory cell in different write states according to an embodiment of the present disclosure. A first voltage difference $V_{DS}$ is created between two voltages respectively applied to the corresponding bit line and the bottom source line. In the embodiment of FIG. 4, "$V_{GS}$" represents a second voltage difference created between a voltage applied to the word line and a voltage of the surrounding channel layer, and "$I_D$" represents the measured current value of the memory cell.

In one embodiment, the bit line BL(1) is applied with the voltage of 0.05V, and the bottom source line SL(1) is applied with the voltage of 0V so as to measure the total current value ($I_t$) and then determine the write state of one selected memory cell C11 defined by the pillar structure T11.

It should be noted that, the curves in FIG. 4 respectively shows the relationships between the current values ($I_D$), which are measured under the condition of the first voltage difference $V_{DS}$ of 0.05V, and the second voltage difference $V_{GS}$ for the memory cell in different write states. The curve "A" represents the relationship between the current values ($I_D$) and the second voltage difference $V_{GS}$ under the condition that the memory cell is in the first state of better conductivity. The curve "B" represents the relationships between the current values ($I_D$) and the second voltage difference $V_{GS}$ under the condition that the memory cell is in the second state of poor conductivity.

As shown in FIG. 4, when the second voltage difference $V_{GS}$ ranges from −0.1V to +0.1V, there is a larger difference between the corresponding current values ($I_D$) of the curve A and the curve B. That is to say, when the second voltage difference $V_{GS}$ falls within the range between −0.1V and +0.1V, it is easier to determine whether the memory cell is in the first state with better conductivity or in the second state with poor conductivity according to the measured current value.

For example, when $V_{GS}$=0V, the current value ($I_D$=$I_{on}$) of the curve A is greater than the current value ($I_D$=$I_{off}$) of the curve B. Accordingly, when the read voltage is set to be 0V and a larger current value is measured, the memory cell is determined to be in the first state. When the measured current value is smaller, the memory cell is determined to be in the second state.

Accordingly, in the present embodiment, if the voltage difference between the corresponding bit line and the corresponding bottom source line is set to be 0.05V, the read voltage would be set to fall within the range between −0.1V and +0.1V. Furthermore, the absolute value of the read voltage is less than that of the threshold voltage (of about 1.5V) to prevent the write state of the selected memory cell from being varied.

Furthermore, when the second voltage difference $V_{GS}$ is greater than 0.3V, no matter the memory cell is in the first state or the second state, the measured current values ($I_D$) will be similar to each other. Accordingly, the word lines corresponding to the other non-selected memory cells are usually applied with the conducting voltage of greater than 0.3V, so that the current value ($I_c$) contributed by the non-selected memory cells is constant. After the total current value ($I_t$) is measured, the current value that is calculated by deducting the current value ($I_c$) from the total current value ($I_t$) reflects the write state of the selected memory cell C11.

It should be noted that, based on arbitrarily selecting one of the memory cells C11 for reading, and referring to FIG. 4 where the second voltage difference $V_{GS}$ is less than 0.3 V, i.e., the conducting voltage is less than 0.3V, the write states of the other non-selected memory cells C11 are unpredictable. Thus, the current value ($I_c$) contributed by the non-selected memory cells C11 will be a variable. As such, even if the total current value ($I_t$) is measured, it is difficult to determine whether the selected memory cell C11 is in the first state or in the second state. Accordingly, in one embodiment, the conducting voltage is greater than 0.3V.

Since the conducting voltage has to be lower than the threshold voltage so as to prevent the write states of the other non-selected memory cells from being changed, and also avoid affecting recognition of the write state of the selected memory cell due to the current value ($I_c$) contributed by the non-selected memory cells C11, the conducting voltage can be set in a range from 0.3V to 1V. As such, when reading the selected memory cell C11, the write states of the other non-selected memory cells C11 may be prevented from being disturbed or even changed. In addition, the current value ($I_c$) contributed by the non-selected memory cells C11 is prevented from affecting determination of the write state of the selected memory cell.

It should be noted that, the aforementioned conducting voltage is just a setting made in accordance with one specific material of the outermost ferroelectric layer 20 and one specific operation condition of the present disclosure, and is not intended to limit the operation method of the three-dimensional memory device in the present disclosure. As long as the conducting voltage is less than the threshold voltage for changing the polarization direction of the outermost ferroelectric layer 20, and the setting of the conducting voltage can avoid affecting determination of the write state of the selected memory cell by the current value (Ic) of the non-selected memory cells C11, the disclosure does not limit the range of setting the conducting voltage It should be noted that, in each of the pillar structures T11-T35 disclosed herein, there includes a conductive core gate column 24, such that any one of the serially connected memory cells C11-C31 can be selected for write state recognition thereof, thereby improving the writing and reading speeds.

Additionally, through the conductive core gate column 24, when data is written into one selected memory cell, different voltages are respectively applied to the corresponding word lines WL1(Z)-WL3(Z), the corresponding conductive core gate column 24, the corresponding bit lines BL(X), and the corresponding the bottom source lines SL(Y). Thus, the write states of the non-selected memory cells can be prevented from being disturbed when writing the data into the selected memory cell.

Figure 5:
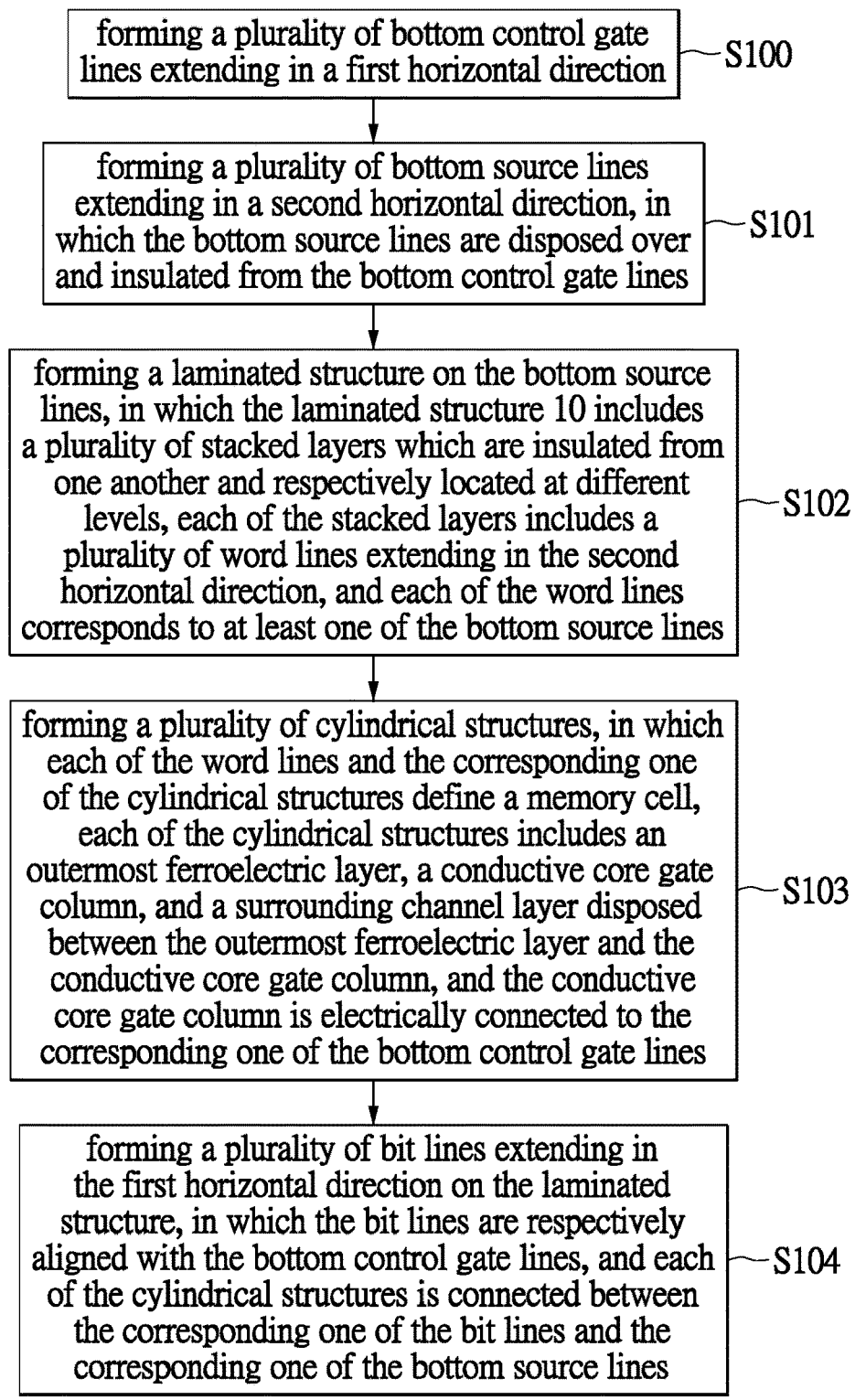
FIG. 5 is a flowchart of a manufacturing method of a three-dimensional memory device according to an embodiment of the present disclosure.

Subsequently, referring to FIG. 5, FIG. 5 is a flowchart of a manufacturing method of a three-dimensional memory device according to an embodiment of the present disclosure.

Firstly, in the step S100, a plurality of bottom control gate lines extending in a first horizontal direction are formed. Then, in the step S101, a plurality of bottom source lines extending in a second horizontal direction are formed, in which the bottom source lines are disposed over and insulated from the bottom control gate lines.

Figures 6A, 6B:
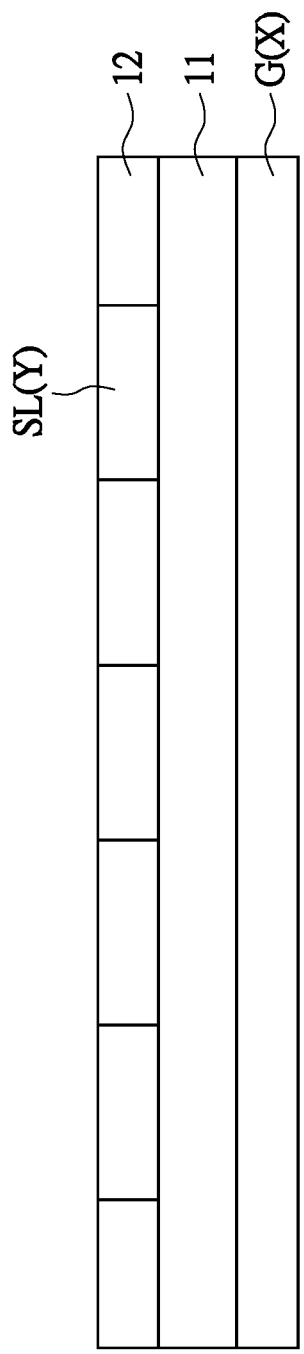
FIG. 6A is a partial sectional view of the three-dimensional memory device in step S100 of FIG. 5.
FIG. 6B is a partial sectional view of the three-dimensional memory device in step S101 of FIG. 5.

Reference is made to FIGS. 6A and 6B, which respectively show partial sectional views of the three-dimensional memory device in steps S100 and S101 of FIG. 5.

As shown in FIG. 6A, the bottom control gate lines G(X) are formed. In one embodiment, the bottom control gate lines G(X) are disposed on a substrate (not shown in FIG. 6A). The material of the bottom control gate lines G(X) is a conductive material. The bottom control gate lines G(X) can be insulated from one another by insulating materials.

Specifically, as shown in FIG. 6A and FIG. 6B, after the step of forming the bottom control gate lines G(X) and before the step of forming the bottom source lines SL(Y), the method further includes a step of forming a bottom insulating layer 11 on the bottom control gate lines G(X). In one embodiment, before the step of forming the bottom insulating layer 11, the insulating materials can be formed in the spaces between the bottom control gate lines G(X).

After forming the bottom insulating layer 11, the bottom source lines SL(Y) are formed on the bottom insulating layer 11. As shown in FIG. 6B, the bottom source lines SL(Y) extend in the second horizontal direction, and are parallelly arranged along the first horizontal direction.

Furthermore, after the bottom source lines SL(Y) are formed, the manufacturing method of the three-dimensional memory device in the disclosed embodiment further includes a step of forming a plurality of insulating portions 12, and each of the insulating portions 12 is disposed between two adjacent bottom source lines SL(Y) so as to insulate one of the two adjacent bottom source lines SL(Y) from the other.

Referring to FIG. 5, subsequently, in step S102, a stacked structure is formed on the bottom source lines, in which the stacked structure 10 includes a plurality of stacked layers which are insulated from one another and respectively located at different levels. Each of the stacked layers includes a plurality of word lines extending in the second horizontal direction, and each of the word lines corresponds to at least one of the bottom source lines.

Figure 6C:
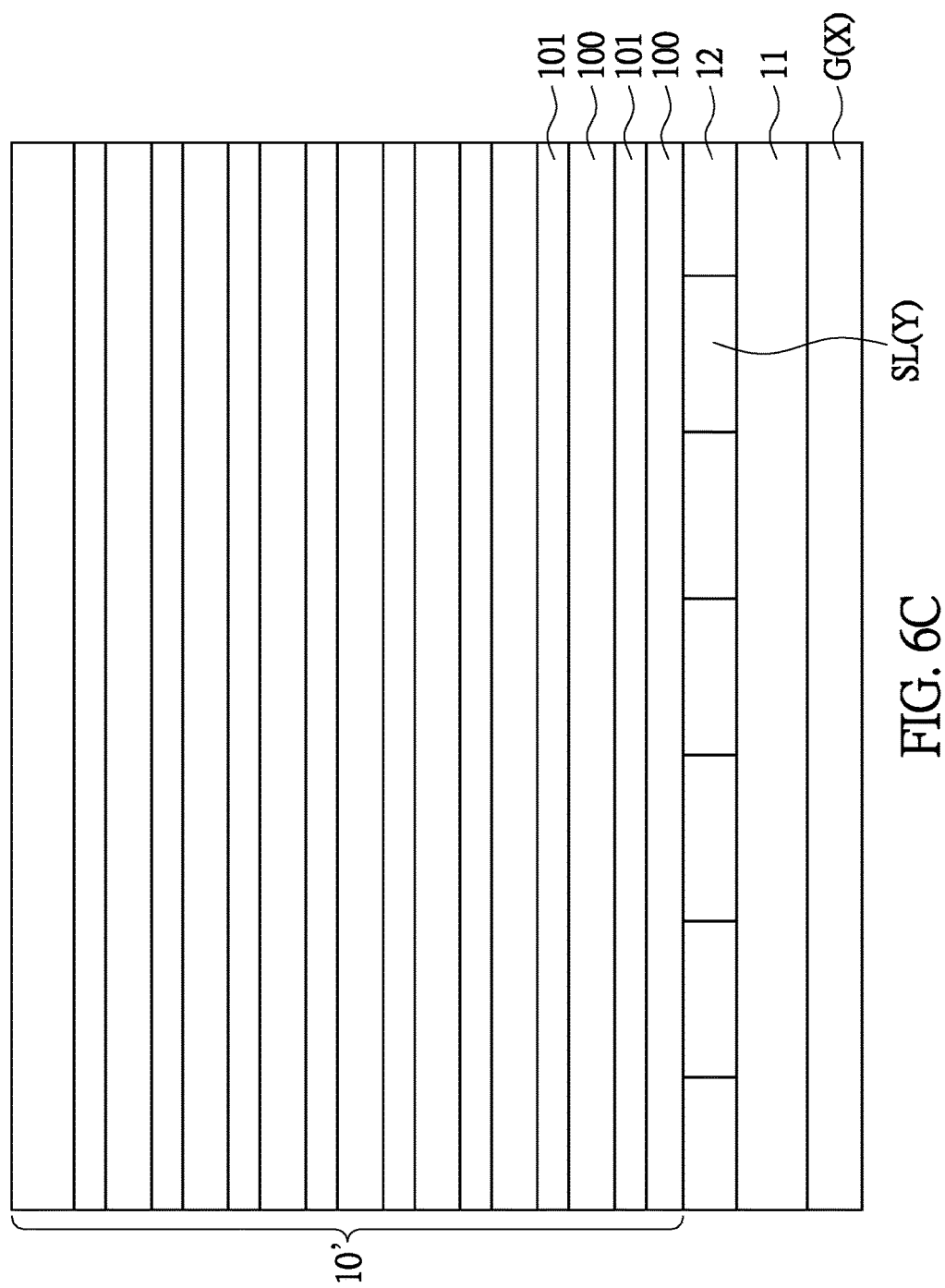
FIG. 6C is a partial sectional view of the three-dimensional memory device in step S102 of FIG. 5.
Figure 6D:
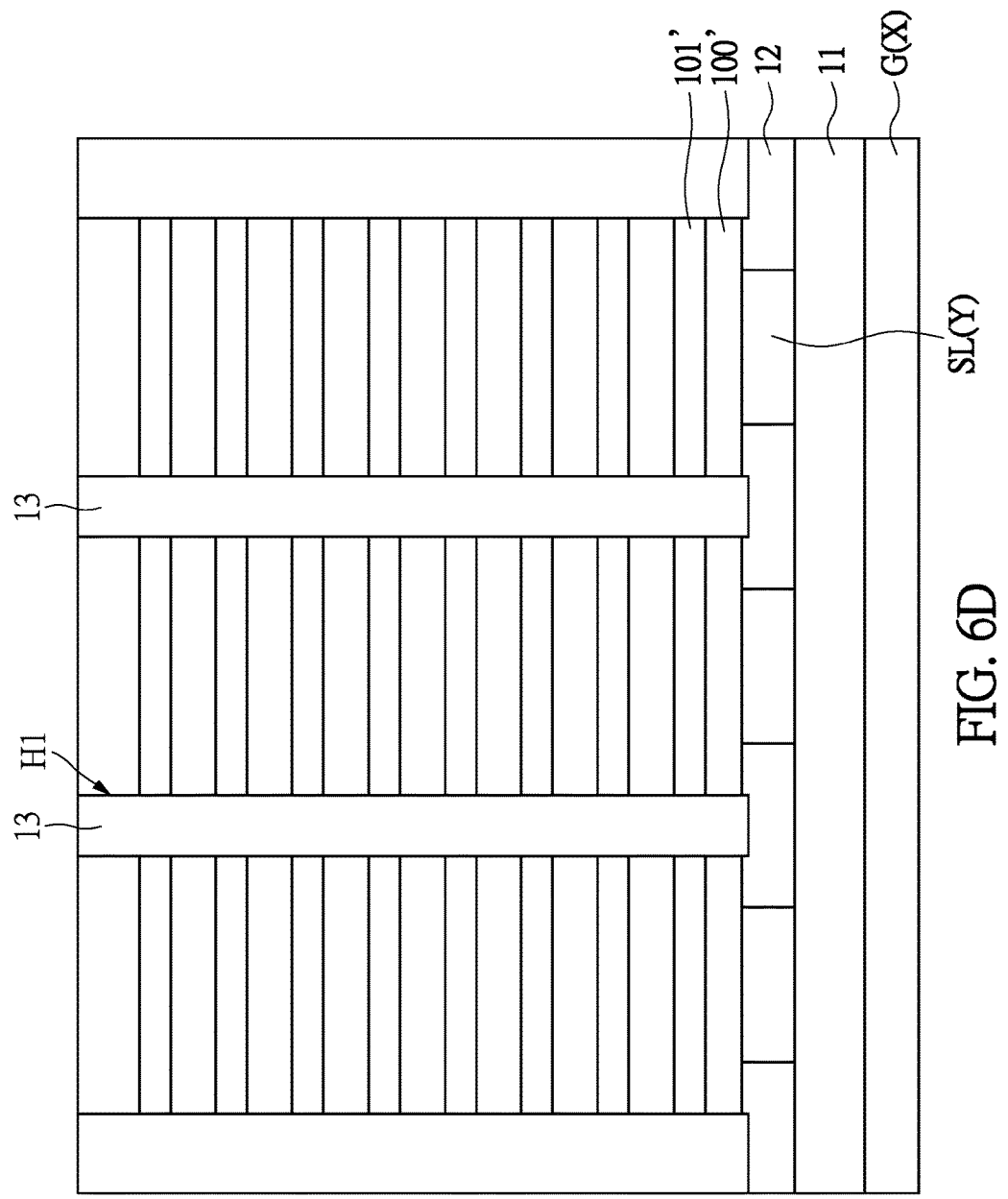
FIG. 6D is a partial sectional view of the three-dimensional memory device in step S102 of FIG. 5.

Reference is made to FIG. 6C to FIG. 6D, which illustrate the details of forming the stacked structure 10. As shown in FIG. 6C, a laminate 10' is formed on the bottom source lines SL(Y). The laminate 10' includes a plurality of insulating layers 100 and a plurality of conductive layers 101, and the insulating layers 100 and the conductive layers 101 are stacked alternately. In one embodiment, the material of the conductive layer 101 can be titanium nitride, tantalum nitride, tungsten nitride, iridium, platinum, palladium or any combination thereof. Furthermore, both the top layer and the bottom layer of the laminate 10' are insulating layers 100, and the conductive layers 101 are the inner layers of the laminate 10'.

Subsequently, as shown in FIG. 6D, a plurality of trenches H1 extending in the second horizontal direction are formed in the laminate 10'. That is to say, the trenches H1 extend between two opposite sides of the laminate 10'. Furthermore, the trenches H1 are dislocated from the bottom source lines SL(Y) along a vertical direction so as to define the word lines. In other words, by forming the trenches H1 in the laminate 10', a portion of each conductive layer 101 can be removed, and the other remaining portion 101' of each conductive layer 101 is disposed over the corresponding one of the bottom source lines SL(Y) to serve as a word line of the three-dimensional memory device. Subsequently, a first insulating material 13 is filled into each of the trenches H1.

Referring to FIG. 5, in step S103, a plurality of pillar structures are formed, in which each of the word lines and the corresponding one of the pillar structures define a memory cell. Each of the pillar structures includes an outermost ferroelectric layer, a conductive core gate column, and a surrounding channel layer disposed between the outermost ferroelectric layer and the conductive core gate column, and the conductive core gate column is electrically connected to the corresponding one of the bottom control gate lines.

Figure 6E:
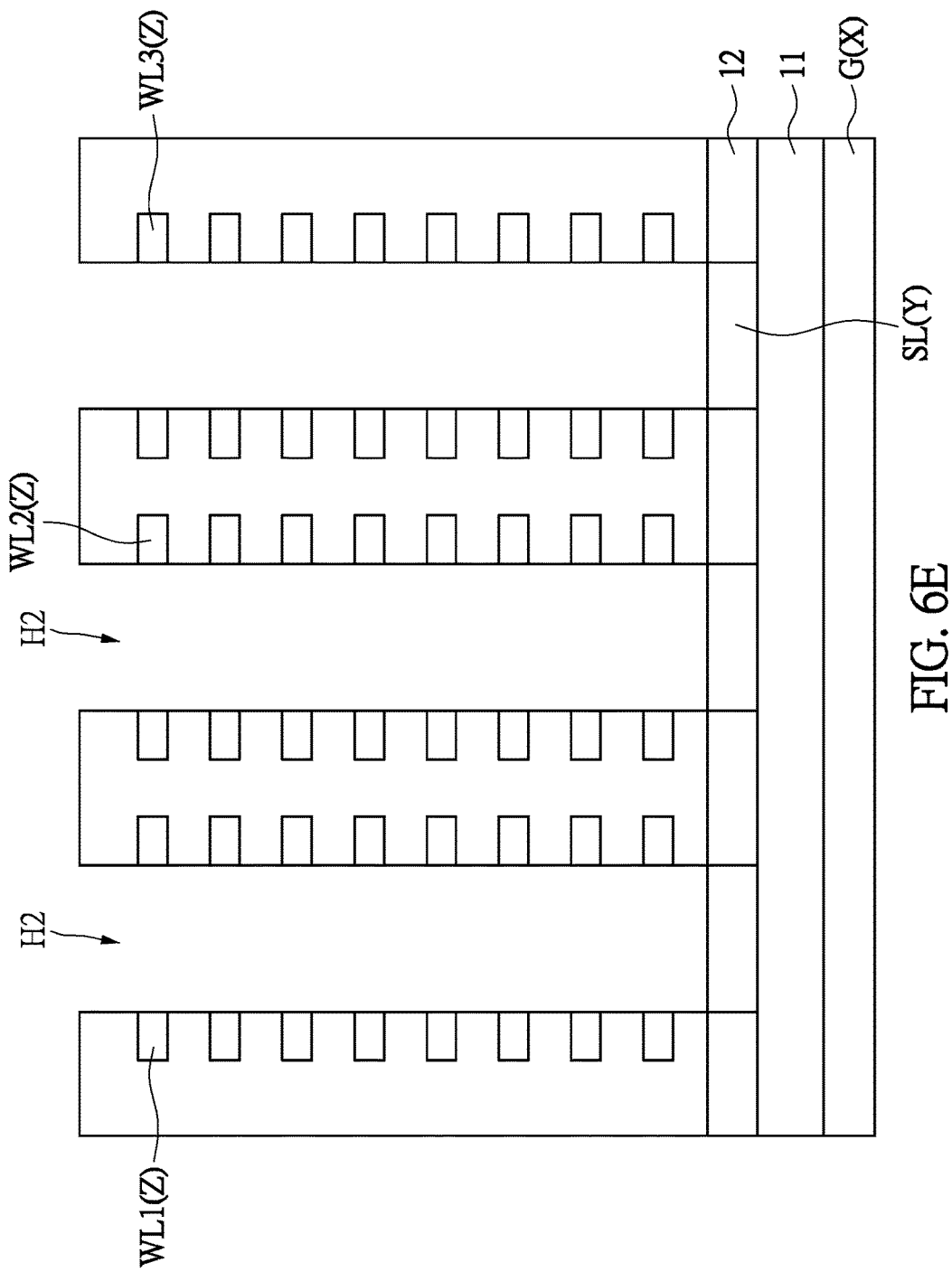
FIG. 6E is a partial sectional view of the three-dimensional memory device in step S103 of FIG. 5.

Reference is made to FIG. 6E to FIG. 6L, which show the details of forming the pillar structures. As shown in FIG. 6E, a plurality of pillar openings H2 that are spaced apart from one another are formed in the laminate 10', and each of the pillar openings H2 extends downwardly from a top surface of the laminate 10' to an upper surface of the corresponding one of the bottom source lines SL(Y). Additionally, along a bird's eye direction, the bit lines BL(X) intersect with the bottom source lines SL(Y) to form multiple intersections, and each of the pillar openings H2 is located at one of the intersections. That is to say, the pillar openings H2 are spaced apart from one another and arranged in an array as looking down from top.

Additionally, each of the pillar openings H2 extends from the top surface of the laminate 10' and passes through all of the conductive layers 101 (i.e., the word lines WL1(Z)-WL3 (Z)) stacked over bottom source lines SL(Y) until the corresponding bottom source line SL(Y) is exposed. As such, each of the word lines WL1(Z)-WL3(Z) has a part exposed at an inner wall surface of the corresponding pillar opening H2.

Figure 6F:
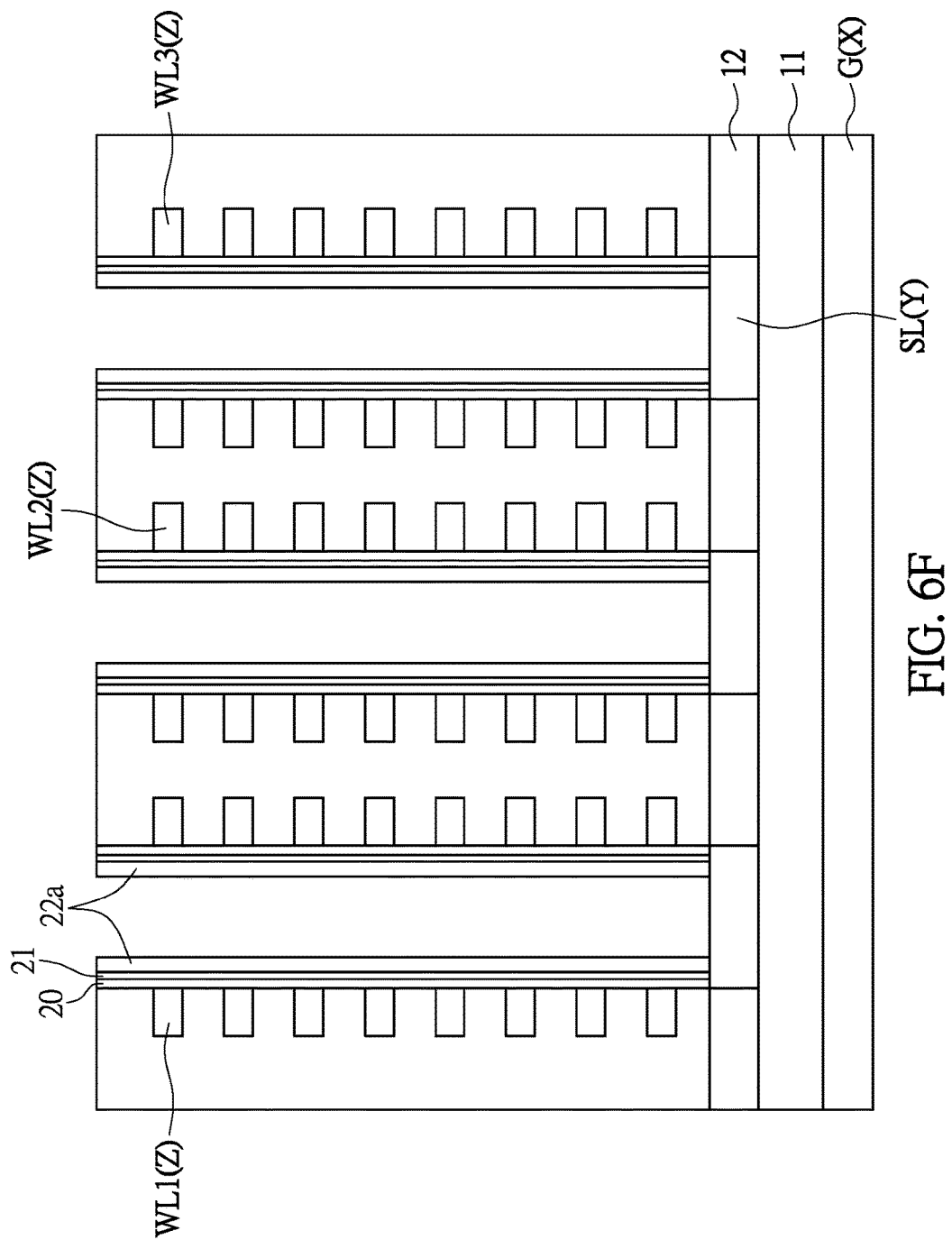
FIG. 6F is a partial sectional view of the three-dimensional memory device in step S103 of FIG. 5.
Figure 6G:
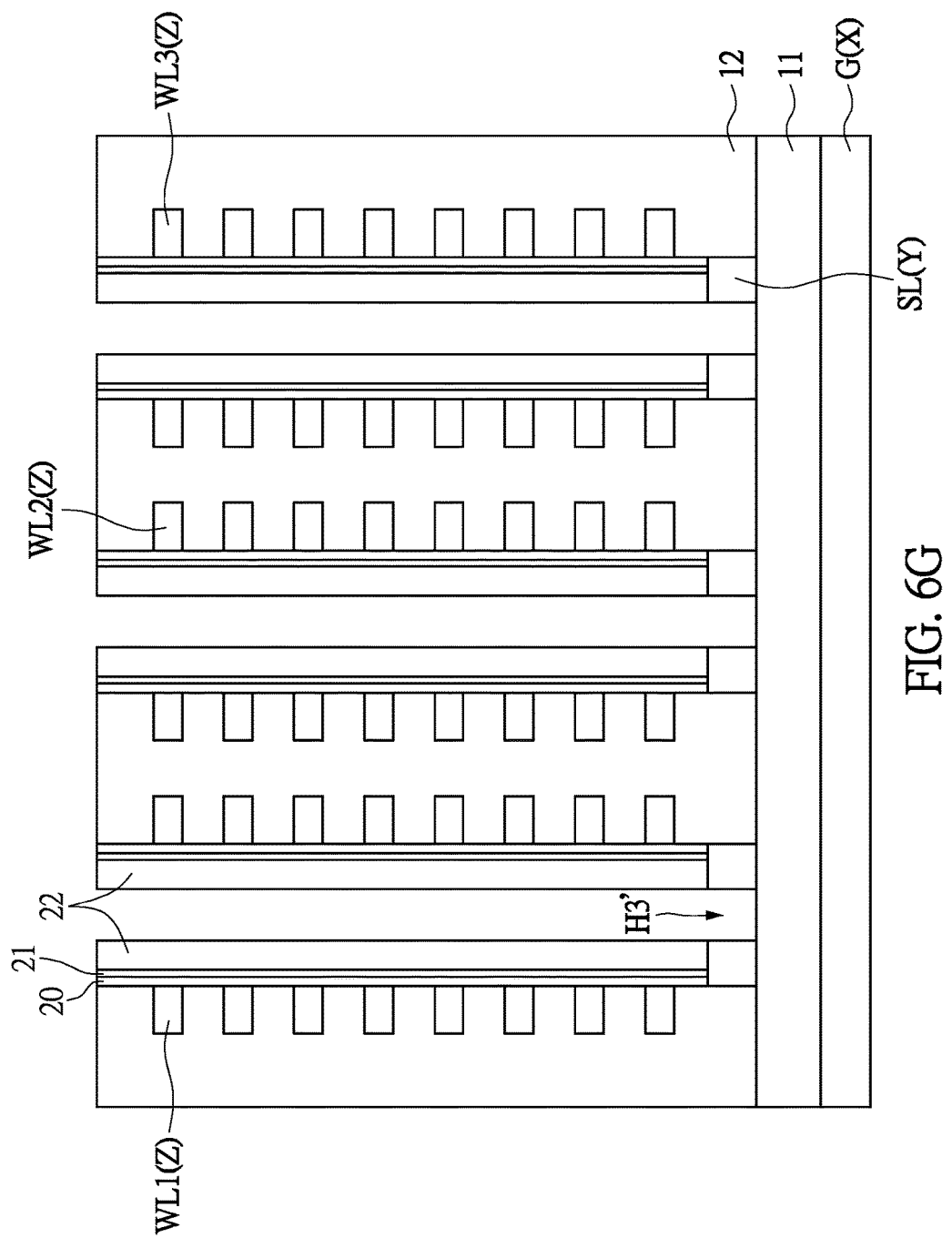
FIG. 6G is a partial sectional view of the three-dimensional memory device in step S103 of FIG. 5.

Subsequently, as shown in FIG. 6F to FIG. 6G, a tube-shaped stacked layer is formed in each of the pillar openings H2. The tube-shaped stacked layer includes an outermost ferroelectric layer 20, an outer dielectric layer 21, and a surrounding channel layer 22.

Specifically, referring to FIG. 6F, firstly, the outermost ferroelectric layer 20, the outer dielectric layer 21, and an outer channel portion 22a are formed.

To be more specific, a ferroelectric material layer, an outer dielectric material layer, and the outer channel portion 22a are sequentially formed to form an initial tube-shaped stacked layer. After the forming the ferroelectric material layer, the ferroelectric material layer covers the inner wall surface of each pillar opening H2. Subsequently, the outer dielectric material layer and the outer channel portion 22a are sequentially formed to cover the surface of the ferroelectric material layer. It should be noted that the outer channel portion 22a is made of polysilicon and insulated from the ferroelectric material layer by the outer dielectric material layer.

Thereafter, a part of the initial tube-shaped stacked layer at a bottom of each pillar opening H2 is removed to expose the bottom surface of each pillar opening H2 and to form the outermost ferroelectric layer 20 and the outer dielectric layer 21, as shown in FIG. 6F. The outermost ferroelectric layer 20 covering the inner wall surface of the pillar opening H2 is in contact with the parts of the corresponding word lines WL1(Z), WL2(Z), or WL3(Z) exposed at the inner wall surface of the corresponding pillar opening H2.

It should be noted that, the aforementioned outer channel portion 22a can protect the ferroelectric material layer and the outer dielectric material layer which have been formed on the inner wall surface of each pillar opening H2 from being removed during the step of removing the part of the initial tube-shaped stacked layer at the bottom of each pillar opening H2. Accordingly, the outer channel portion 22a is not required to be especially thick, and the thickness of the outer channel portion 22a may be approximately within a range of 3 to 7 nm.

Subsequently, as shown in FIG. 6G, an inner channel portion is formed in each pillar opening H2 to form the surrounding channel layer 22, the inner channel portion covering the initial tube-shaped stacked layer and the bottom surface of the pillar opening H2. Specifically, a polysilicon material is deposited in each pillar opening H2 to form the inner channel portion. The inner channel portion formed in this step and the outer channel portion 22a formed in the step of FIG. 6F jointly form the surrounding channel layer 22.

Figure 6H:
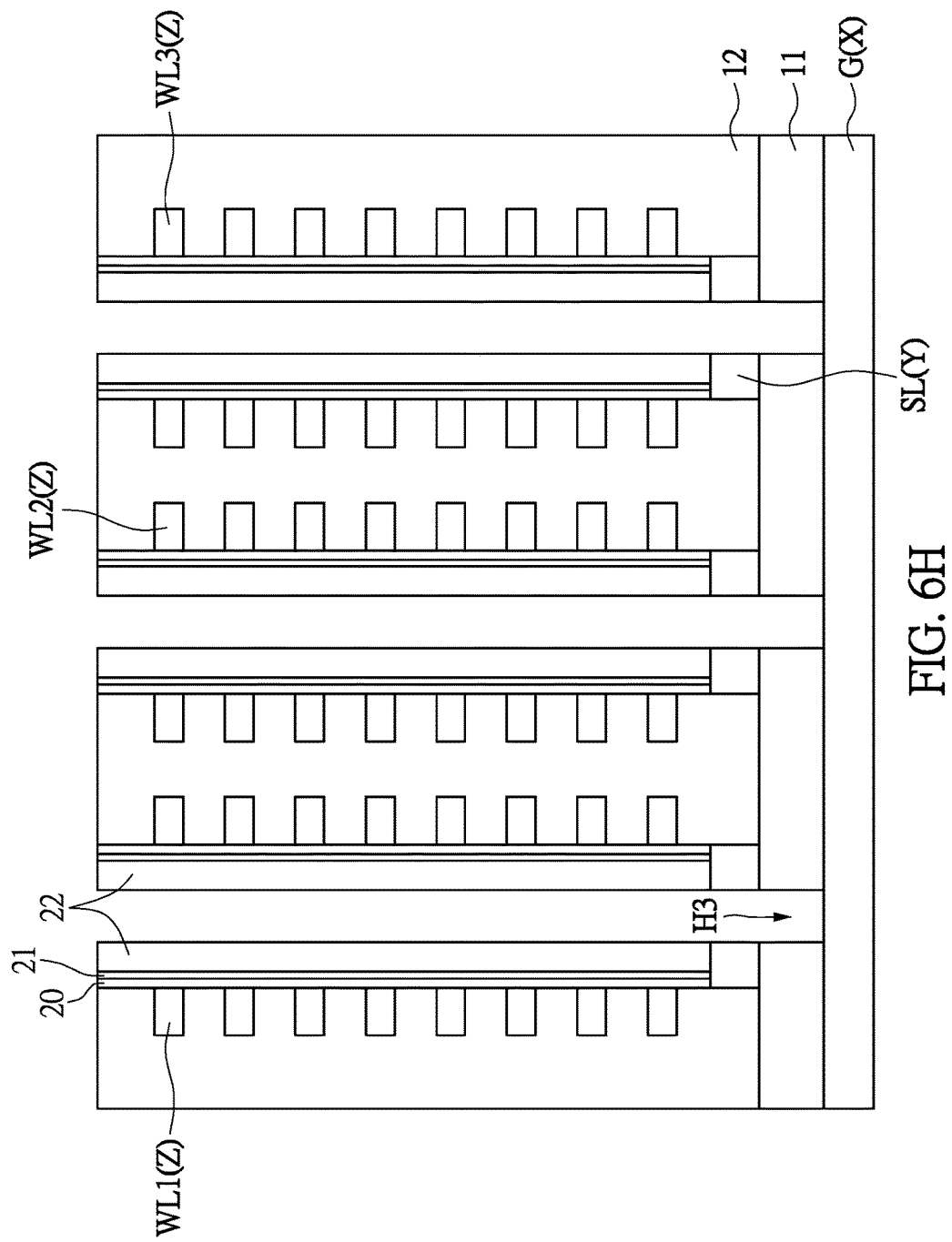
FIG. 6H is a partial sectional view of the three-dimensional memory device in step S103 of FIG. 5.

References are made to FIG. 6G and FIG. 6H. Subsequently, an etching step is performed through the tube-shaped stacked layer to form an extending hole H3 at the bottom of each pillar opening H2.

Specifically, as shown in FIG. 6G, a portion of the inner channel portion at the bottom of each pillar opening H2 is removed, and then the etching step is performed through the tube-shaped stacked layer to form an initial extending hole H3' at the bottom of each pillar opening H2.

As shown in FIG. 6H, a portion of the bottom insulating layer 11 under each of the bottom source lines SL(Y) is being etched to form the aforementioned extending holes H3. Accordingly, each extending hole H3 extends downward from the upper surface of the corresponding bottom source line SL(Y) until the corresponding one of the bottom control gate lines G(X) is exposed.

Figure 6I:
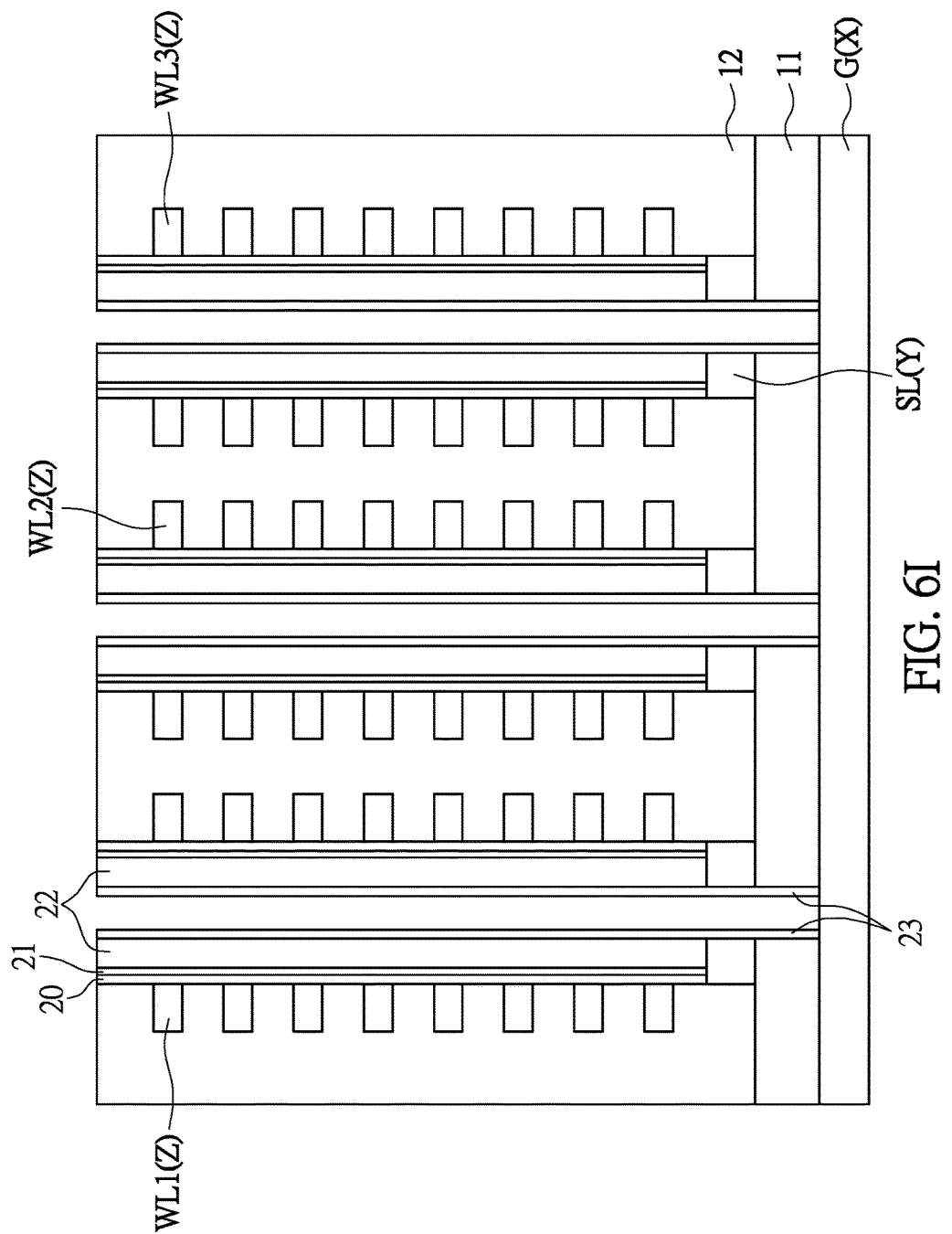
FIG. 6I is a partial sectional view of the three-dimensional memory device in step S103 of FIG. 5.

Referring to FIG. 6I, subsequently, an inner dielectric layer 23 is formed inside each tube-shaped stacked layer. In one embodiment, an inner dielectric material layer is formed to cover the inner sidewall of the surrounding channel layer 22 of each tube-shaped stacked layer. Since the inner dielectric material layer also covers the corresponding one of the bottom control gate lines G(X), another etching step is then performed to remove a portion of the inner dielectric material layer to expose the corresponding one of the bottom control gate lines G(X). Furthermore, another portion of the inner dielectric material layer that is not removed serves as the inner dielectric layer 23.

Figure 6J:
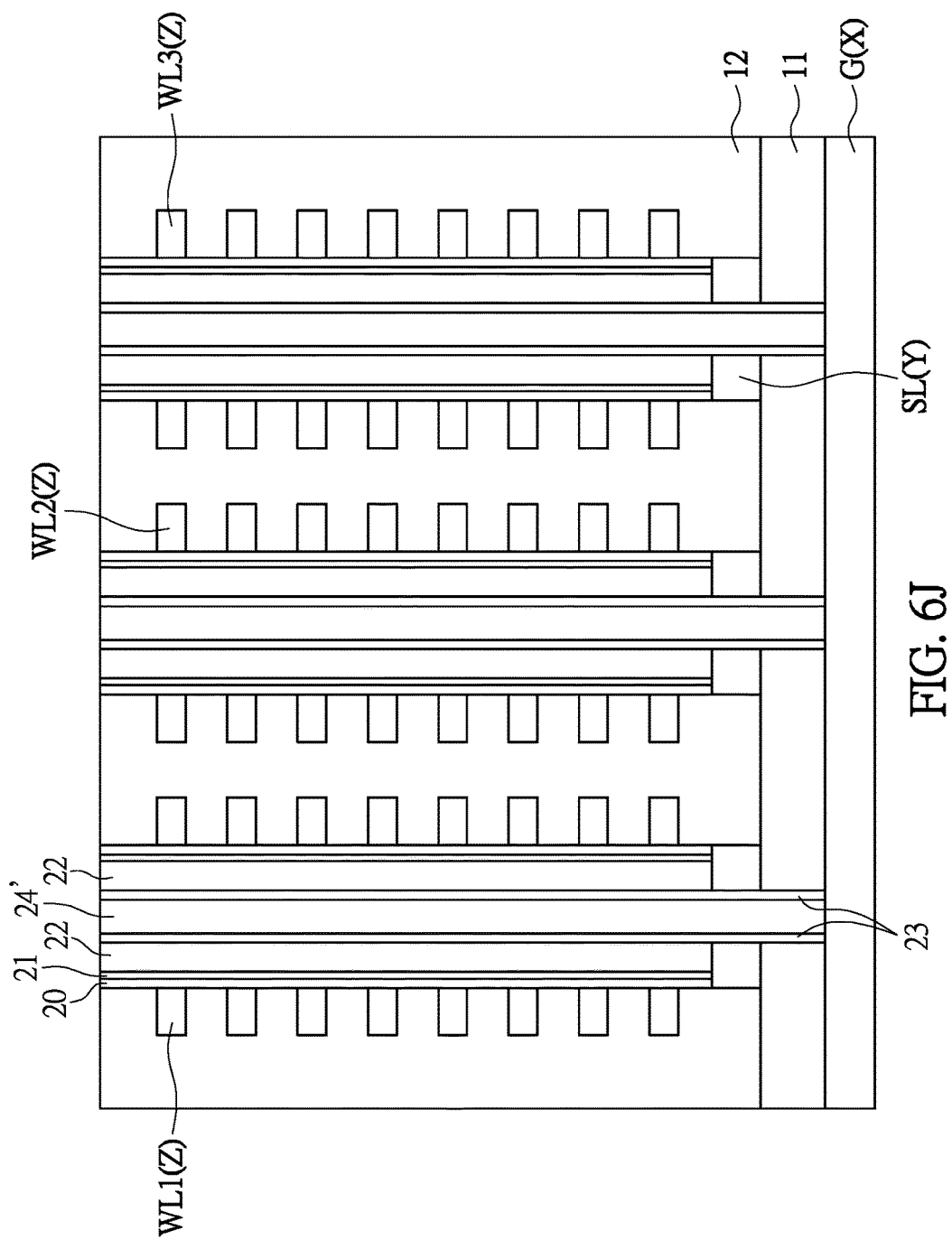
FIG. 6J is a partial sectional view of the three-dimensional memory device in step S103 of FIG. 5.

Referring to FIG. 6J, a conductive core gate column 24' is formed in each extending hole H3 and in the remaining space of each of the pillar openings H2, and the conductive core gate column 24' is in contact with the corresponding one of the bottom control gate lines G(X). Accordingly, the conductive core gate column 24' can be insulated from the surrounding channel layer 22 by the inner dielectric layer 23. Additionally, by applying a voltage to the bottom control gate line G(X) that is connected to the conductive core gate column 24', a current channel can be generated at an inner portion of the surrounding channel layer 22 closer to the conductive core gate column 24'.

Figure 6K:
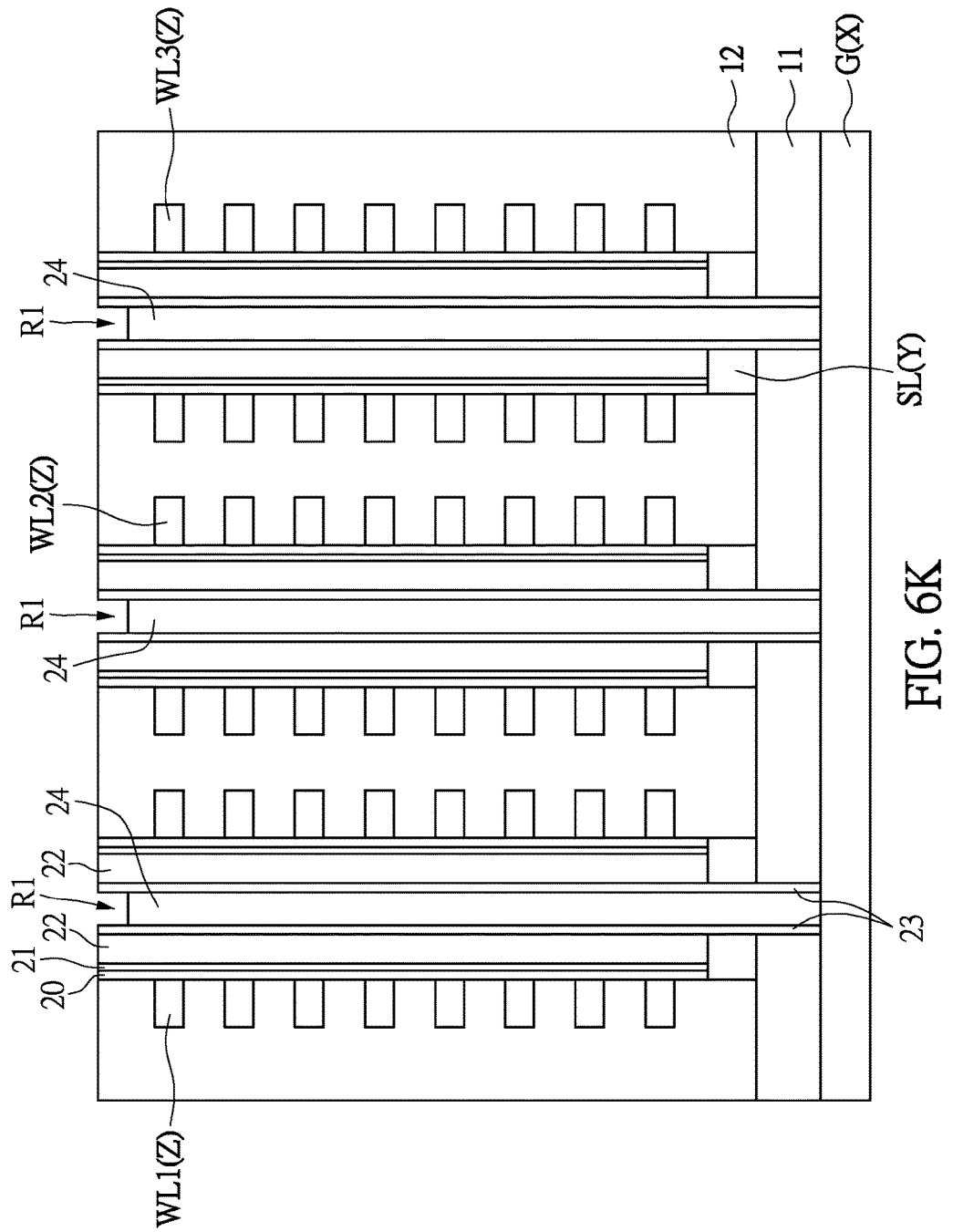
FIG. 6K is a partial sectional view of the three-dimensional memory device in step S103 of FIG. 5.
Figure 6L:
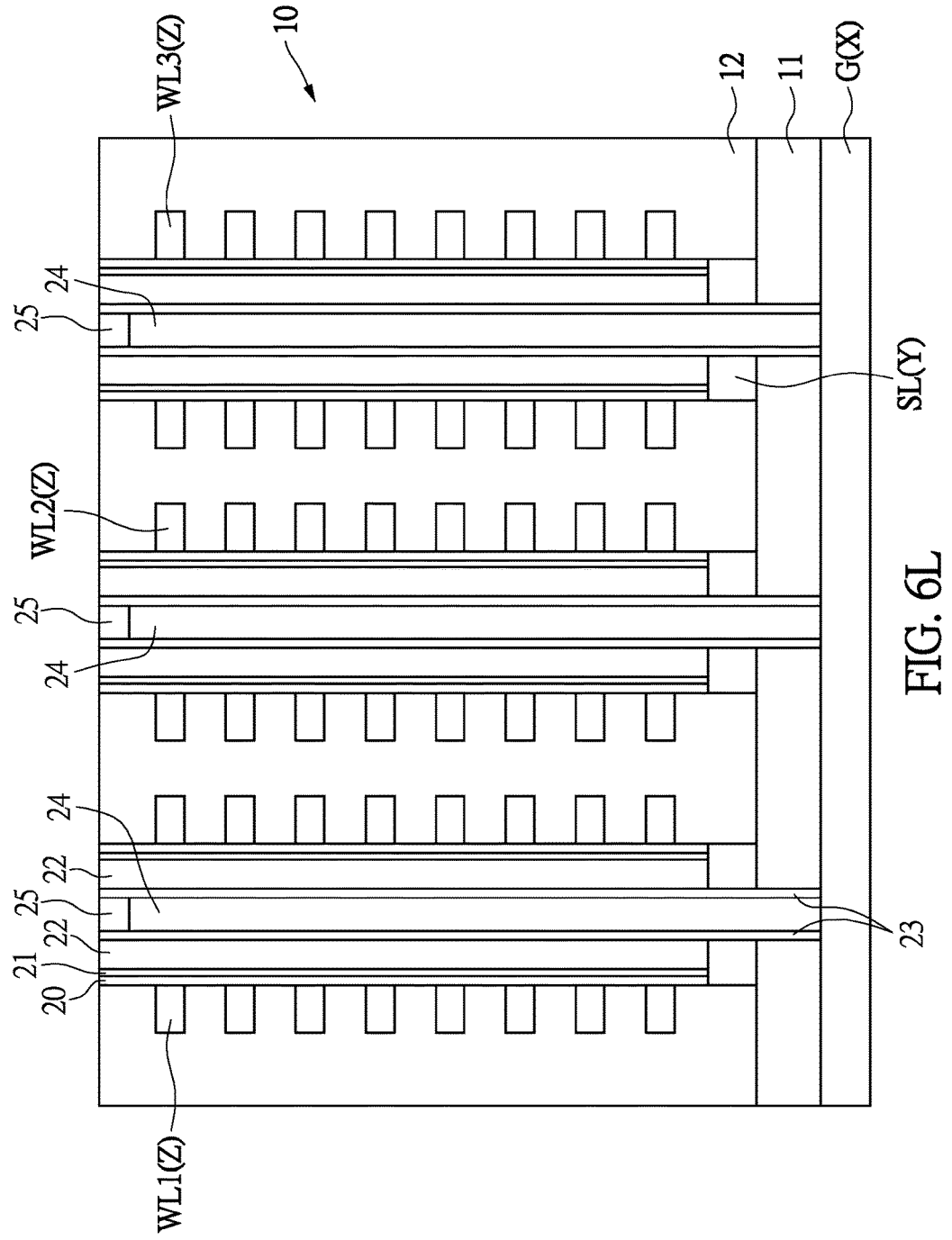
FIG. 6L is a partial sectional view of the three-dimensional memory device in step S103 of FIG. 5.
Figure 6M:
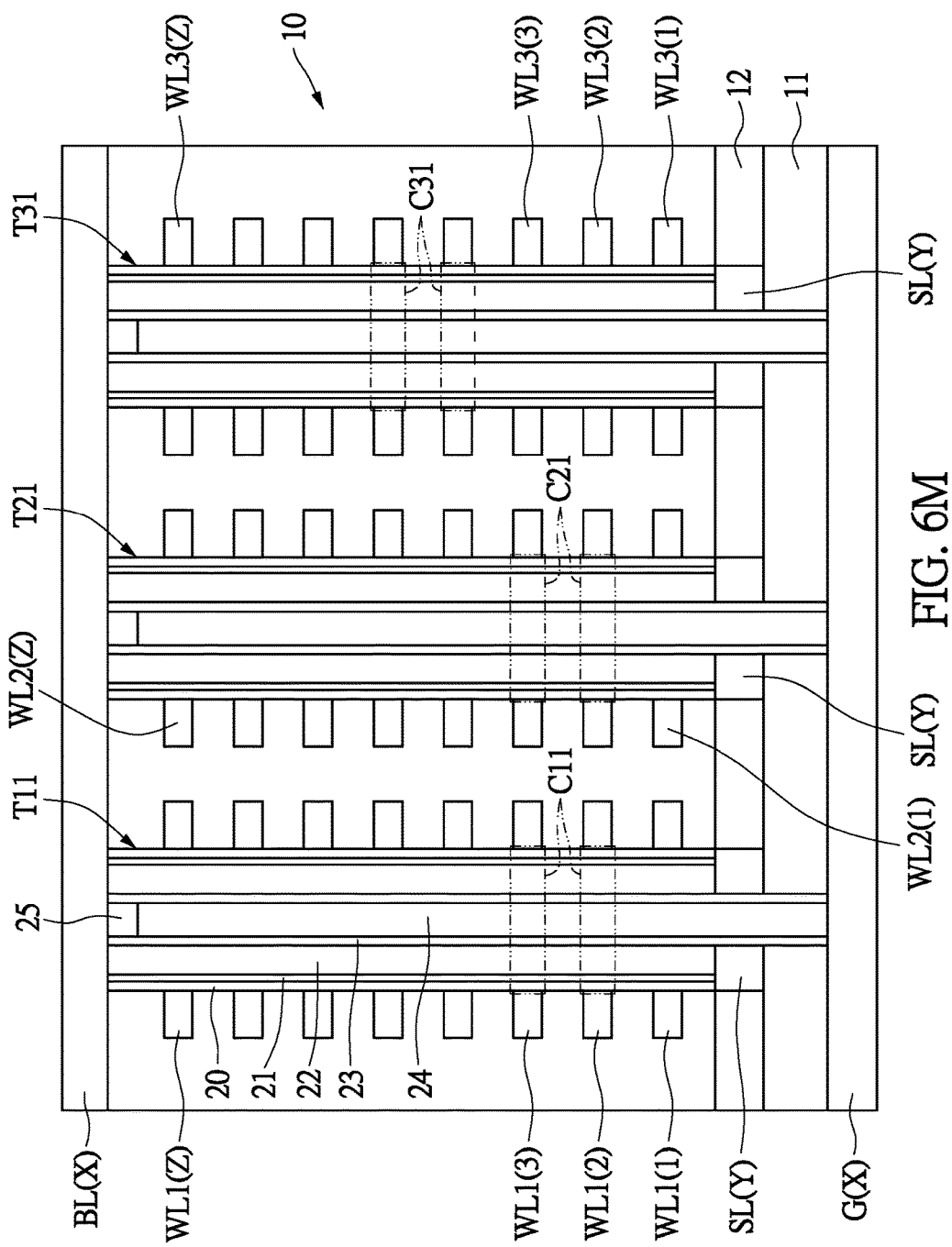
FIG. 6M is a partial sectional view of the three-dimensional memory device in step S104 of FIG. 5.

Referring to FIG. 6K, subsequently, a top portion of each conductive core gate column 24' is removed, such that a top end of each conductive core gate column 24 is depressed from a top surface of the tube-shaped stacked layer and a top surface of the inner dielectric layer 23 so as to form a recess R1. Thereafter, as shown in FIG. 6L, each recess R1 is filled with a second insulating material to form a core insulating portion 25 connected to the corresponding conductive core gate column 24.

By performing the abovementioned processes, the stacked structure 10 and the pillar structures disposed therein can be formed, as described in the steps S102 and S103 shown in FIG. 5.

As shown in step S104 of FIG. 5 and FIG. 6K, a plurality of bit lines BL(X) extending in the first horizontal direction are formed on the stacked structure 10, in which the bit lines BL(X) are respectively aligned with the bottom control gate lines G(X), and each of the pillar structures T11-T31 is connected between the corresponding one of the bit lines BL(X) and the corresponding one of the bottom source lines SL(Y).

That is to say, the bit lines BL(X) respectively overlap with the bottom control gate lines G(X). Furthermore, each of the bit lines BL(X) is electrically connected to the surrounding channel layer 22 of the corresponding one of the pillar structures T11-T31. However, the conductive core gate column 24 of each of the pillar structures T11-T31 is insulated from the corresponding one of the bit lines BL(X) by the core insulating portion 25. Accordingly, by the manufacturing method provided in the disclosed embodiment, the three-dimensional memory device 1 shown in FIG. 1 to FIG. 3 can be fabricated.

In summary, one of the advantages of the present disclosure is that in the three-dimensional memory device 1 and the manufacturing method thereof, each of the pillar structures T11-T35 includes the conductive core gate column 24. As such, when the write state of one of the memory cells C11 (C21, C31) which correspond to the same pillar structure T11 (T21, T31) is read, the conductive core gate column 24 can be applied with a voltage to generate a current flowing through the surrounding channel layer and establish the electrical connection between the corresponding one of bit lines BL(X) and the corresponding one of the bottom source lines SL(Y). Accordingly, the current value of the selected memory cell C11 (C21, C31) can be measured. When reading the write state of one of the serially connected memory cells C11 (C21, C31), the read voltage can be directly applied to the word line WL1(Z)(WL2(Z), WL3(Z)) corresponding to the selected memory cell C11 (C21, C31). That is to say, it is not necessary for the word lines WL1(Z)(WL2(Z), WL3(Z)) respectively located at different levels to be applied with the read voltage in terms of a particular level sequence of the memory cells, thereby improving the speeds of writing and reading.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A three-dimensional memory device comprising:
a plurality of bottom control gate lines extending in a first horizontal direction and arranged in parallel; and
a plurality of bottom source lines disposed over the bottom control gate lines, wherein the bottom source lines extend in a second horizontal direction and intersect with the bottom control gate lines;
a stacked structure disposed on the bottom source lines, wherein the stacked structure includes a plurality of stacked layers which are insulated from one another and respectively located at different levels, each of the stacked layers includes a plurality of word lines extending in the second horizontal direction, and each of the word lines corresponds to at least one of the bottom source lines;
a plurality of bit lines disposed on the stacked structure and extending in the first horizontal direction, wherein the orthogonal projections of the bit lines intersect the bottom source lines; and
a plurality of pillar structures passing through the stacked structure, wherein each of the pillar structures is connected between the corresponding one of the bit lines and the corresponding one of the bottom source lines, and each of the word lines and the corresponding one of the pillar structures define a memory cell;
wherein each of the pillar structures includes an outermost ferroelectric layer, a conductive core gate column, and a surrounding channel layer disposed between the outermost ferroelectric layer and the conductive core gate column, and the conductive core gate column is electrically connected to the corresponding one of the bottom control gate lines.

2. The three-dimensional memory device according to claim 1, wherein the conductive core gate column passes through the corresponding one of the bottom source lines to be electrically connected to the corresponding one of the bottom control gate lines.

3. The three-dimensional memory device according to claim 1, wherein each of the pillar structures further includes an inner dielectric layer and an outer dielectric layer, the inner dielectric layer is disposed between the surrounding channel layer and the conductive core gate column, and the outer dielectric layer is disposed between the surrounding channel layer and the outermost ferroelectric layer.

4. The three-dimensional memory device according to claim 3, wherein each of the materials of the inner dielectric layer and the outer dielectric layer is silicon oxide, silicon nitride, or silicon oxynitride.

5. The three-dimensional memory device according to claim 1, wherein the surrounding channel layer is electrically connected between the corresponding one of the bottom source lines and the corresponding one of the bit lines.

6. The three-dimensional memory device according to claim 1, wherein the outermost ferroelectric layer is in contact with the corresponding one of the word lines, and the material of the outermost ferroelectric layer includes a ferroelectric material and dopants, the ferroelectric material is hafnium oxide, hafnium zirconium oxide, or zirconium titanium oxide, and the dopants are silicon, aluminum, lanthanum, yttrium, strontium, gadolinium, niobium, nickel, tantalum, or any combination thereof.

7. The three-dimensional memory device according to claim 1, further comprising a bottom insulating layer by which each bottom control gate line and each bottom source line are insulated from each other.

8. The three-dimensional memory device according to claim 1, wherein each pillar structure further includes a core insulating portion by which the conductive core gate column is insulated from the bit line connected to the pillar structure.

* * * * *